US008232804B2

(12) United States Patent
Fong (10) Patent No.: US 8,232,804 B2
(45) Date of Patent: Jul. 31, 2012

(54) TIME ALERT DEVICE FOR USE TOGETHER WITH AN EARTH LEAKAGE PROTECTION DEVICE

(76) Inventor: See Ni Fong, Kuala Lumpur (MY)

( * ) Notice: Subject to any disclaimer, the term of this patent is extended or adjusted under 35 U.S.C. 154(b) by 670 days.

(21) Appl. No.: 12/226,664

(22) PCT Filed: Mar. 26, 2007

(86) PCT No.: PCT/MY2007/000017
§ 371 (c)(1),
(2), (4) Date: Mar. 9, 2009

(87) PCT Pub. No.: WO2007/123390
PCT Pub. Date: Nov. 1, 2007

(65) Prior Publication Data
US 2010/0052691 A1 Mar. 4, 2010

(30) Foreign Application Priority Data
Apr. 26, 2006 (MY) .............................. PI20070231
Feb. 16, 2007 (MY) .............................. PI20061907

(51) Int. Cl.
*G01R 31/02* (2006.01)
(52) U.S. Cl. ............ 324/424; 361/42; 361/47; 324/509; 324/536; 324/713
(58) Field of Classification Search .................. 324/424
See application file for complete search history.

(56) References Cited

U.S. PATENT DOCUMENTS

| 4,159,501 A * | 6/1979 | White ............................. 361/47 |
| 4,560,936 A * | 12/1985 | Pelowski ........................ 324/418 |
| 4,761,704 A * | 8/1988 | Fraisse et al. ................... 361/50 |
| 5,600,524 A * | 2/1997 | Neiger et al. ................... 361/42 |
| 5,715,125 A * | 2/1998 | Neiger et al. ................... 361/42 |
| 5,781,024 A * | 7/1998 | Blomberg et al. ........ 324/750.02 |
| 5,796,636 A * | 8/1998 | Andrews ........................ 702/117 |
| 5,982,593 A * | 11/1999 | Kimblin et al. ................. 361/42 |
| 6,262,871 B1 * | 7/2001 | Nemir et al. .................... 361/42 |
| 6,629,021 B2 * | 9/2003 | Cline et al. ..................... 700/300 |
| 6,807,037 B1 * | 10/2004 | Patruno et al. .................. 361/42 |
| 6,882,158 B2 * | 4/2005 | Blades ............................ 324/536 |
| 6,882,511 B1 * | 4/2005 | Patruno et al. .................. 361/42 |
| 6,927,579 B2 * | 8/2005 | Blades ............................ 324/536 |

(Continued)

FOREIGN PATENT DOCUMENTS
DE 2740744 B1 9/1977

(Continued)

*Primary Examiner* — Timothy J Dole
*Assistant Examiner* — Benjamin M Baldridge
(74) *Attorney, Agent, or Firm* — Bacon & Thomas, PLLC (57) ABSTRACT

This invention relates to a time alert device (1) for use with an earth leakage protection device comprising a microprocessor system (10) provided with a software controlled alert trigger timer (22). On time out of the alert trigger timer, the microprocessor system (10) initiates an audible and/or visual annunciation to remind the user of the earth leakage protection device to perform integrity test on the earth leakage protection device. If the earth leakage protection device fails the integrity test, the user detects that the earth leakage protection device could be faulty and needs expert attention. If the earth leakage device passes the integrity test, the alert trigger timer is reset for another predetermined time interval to remind the user to perform another integrity test on the earth leakage protection device. The time alert device can be further provided with a message display panel.

20 Claims, 8 Drawing Sheets

U.S. PATENT DOCUMENTS

| | | | |
|---|---|---|---|
| 7,057,401 B2 * | 6/2006 | Blades | 324/713 |
| 7,605,594 B2 * | 10/2009 | Blades | 324/713 |
| 2003/0201780 A1 * | 10/2003 | Blades | 324/523 |
| 2004/0174173 A1 * | 9/2004 | Elms et al. | 324/509 |
| 2005/0063109 A1 * | 3/2005 | Baldwin | 361/42 |
| 2008/0204034 A1 * | 8/2008 | Blades | 324/522 |

FOREIGN PATENT DOCUMENTS

| | | |
|---|---|---|
| DE | 27 40 744 B1 | 1/1979 |
| EP | 0665623 A1 | 9/1994 |
| EP | 0 665 623 A1 | 8/1995 |
| GB | 2118310 A | 4/1982 |
| GB | 2 118 310 A | 10/1983 |

* cited by examiner

TIME ALERT DEVICE FOR USE TOGETHER WITH AN EARTH LEAKAGE PROTECTION DEVICE

FIELD OF INVENTION

This invention relates to a time alert device for use with an earth leakage protection device that provides an audible and/or visual alert to remind the user of the earth leakage protection device to perform integrity test on the earth leakage protection device at a preset time interval.

BACKGROUND OF THE INVENTION

Earth leakage protection devices such as RCDs (residual current devices) or GFCIs (ground fault circuit interrupters) or ELCB (earth leakage circuit breakers) are electrical devices installed to give protection against electrocution and can reduce the risk of fire arising from insulation failure in the electrical installation. For instance, earth leakage protection devices of the current operated type typically operate with a residual current in the order of 30 mA to 100 mA and this level of protection can never be equaled by circuit breakers or fuses alone. A malfunctioning earth leakage protection device would not serve its intended function and would not give protection against electrocution and the risks associated with insulation failure. It is therefore important to be able to perform non-destructive tests on earth leakage protection devices on a regular basis to ensure that malfunctioning earth leakage protection devices are detected and replaced before something undesired happen. For this purpose, each earth leakage protection device is provided with a test button to check the electromechanical integrity of the earth leakage protection device. As a caution to the users of earth leakage protection devices, on most earth leakage protection devices a label instructs the user to check the function of the earth leakage protection device at regular intervals and to observe that the earth leakage protection device trips instantly. Indeed, it is a requirement under Regulation 514-12-02 of IEE Wiring Regulation to include such a label in indelible characters on an earth leakage protection device so as to remind user to perform integrity test on the earth leakage protection device quarterly, while UL recommends testing the earth leakage protection devices once a month to verify they are working properly. In practice, most users do not bother to perform such check on the electromechanical integrity of the earth leakage protection devices, such as the integrity of the sensing circuit and the trip mechanism, mostly because users are not aware of the needs and importance of such integrity tests. As a result, a malfunctioning earth leakage protection device may go undetected until a tragedy or loss of property happens.

It is therefore useful to have a device where the users are reminded periodically to perform integrity tests on the earth leakage protection devices. If an earth leakage protection device fails the integrity test, the user detects that the earth leakage protection device needs to be replaced. Through such reminders at preset time intervals to perform integrity tests, the loss of life or property due to malfunctioning earth leakage protection device could be minimised.

SUMMARY OF INVENTION

According to one aspect of this invention, it is provided a time alert device for use together with an earth leakage protection device comprising a microprocessor system with a CPU, memory, an alert trigger timer and an I/O interface (input/output interface); at least one annunciator electrically connected to the I/O interface of the microprocessor system, the annunciator being triggered at a preset time interval set in the alert trigger timer of the microprocessor system to alert a user to perform an integrity test on the earth leakage protection device on the time-out of the alert trigger timer; a tripping initiation circuit with the ends of the tripping initiation circuit connected in use to the live and neutral wires on the load side of the electrical installation zone protected by the earth leakage protection device to enable the user of the earth leakage protection device to intentionally generate an earth leakage current during performance of integrity test; test performance detection means to enable the microprocessor system determines that the user has performed an integrity test on the earth leakage protection device; trip detection means connected in use to the live and neutral wires on the load side of the electrical installation zone protected by the earth leakage protection device with the output of the trip detection means interfaced with the microprocessor system through the I/O interface to detect tripping of the earth leakage protection device and a power supply unit providing power to the time alert device wherein the alert trigger timer and the annunciators reset only if the trip detection means detects the tripping of electricity supply confining successful integrity test on the earth leakage protection device.

According to another aspect of this invention, it is provided a time alert device for use together with an earth leakage protection device comprising a microprocessor system with a CPU, memory, an alert trigger timer, a trip time timer and an I/O interface (input/output interface); a trip detection means to detect tripping of the earth leakage protection device; at least one annunciator electrically connected to the I/O interface of the microprocessor system, the annunciator being triggered at a preset time interval set in the alert trigger timer of the microprocessor system to alert a user to perform an integrity test on the earth leakage protection device on the time-out of the alert trigger timer; a tripping initiation circuit with the ends of the tripping initiation circuit connected in use to the live and neutral wires on the load side of the electrical installation zone protected by the earth leakage protection device to enable the user of the earth leakage protection device to intentionally generate an earth leakage current during performance of integrity test; test performance detection means to enable the microprocessor system determines that the user has performed an integrity test on the earth leakage protection device; trip detection means connected in use to the live and neutral wires on the load side of the electrical installation zone protected by the earth leakage protection device with the output of the trip detection means interfaced with the microprocessor system through the I/O interface to detect tripping of the earth leakage protection device and a power supply unit providing power to the time alert device wherein the alert trigger timer resets only if the trip detection means detects the tripping of electricity supply confirming successful integrity test on the earth leakage protection device and only if the trip time of the earth leakage protection device, as measured by the trip time timer is within a prescribed tripping time range typically 30 ms to 200 ms, depending on the sensitivity of the earth leakage protection device and the leakage current.

BRIEF DESCRIPTION OF THE DRAWINGS

The features and usefulness of the invention will be more readily appreciated from the following detailed description when read in conjunction with the accompanying drawings, in which:

FIG. 3 is a block diagram showing one configuration for the interconnections between the time alert device of this invention, an appliance (load) and an earth leakage protection device of the residual current operated type for which the time alert device is to be used together with.

FIG. 4 is a block diagram showing one configuration for the interconnections between the time alert device of this invention, an appliance and an earth leakage protection device of the voltage operated type for which the time alert device is to be used together with.

DETAILED DESCRIPTION OF THE INVENTION

The invention will now be described with reference to the accompanying drawings, wherein like reference numerals designate corresponding or identical elements throughout the various drawings. Since an earth leakage protection device is a commercially available component, its operation is well known to those skilled in the art and is not described here.

In accordance with the present invention, it is provided a time alert device (1) for use together with an earth leakage protection device (2 or 6) such as a RCD (residual current device) or GFCI (ground fault circuit interrupter) or ELCB (earth leakage circuit breaker) to alert the user of an electrical installation zone protected by the earth leakage protection device (2 or 6) to perform integrity tests periodically on the earth leakage protection device (2 or 6) and on the earth connection wiring (45) if the user had not, within a predetermined time, performed the integrity test on the earth leakage protection device on his own accord.

Figure 1:
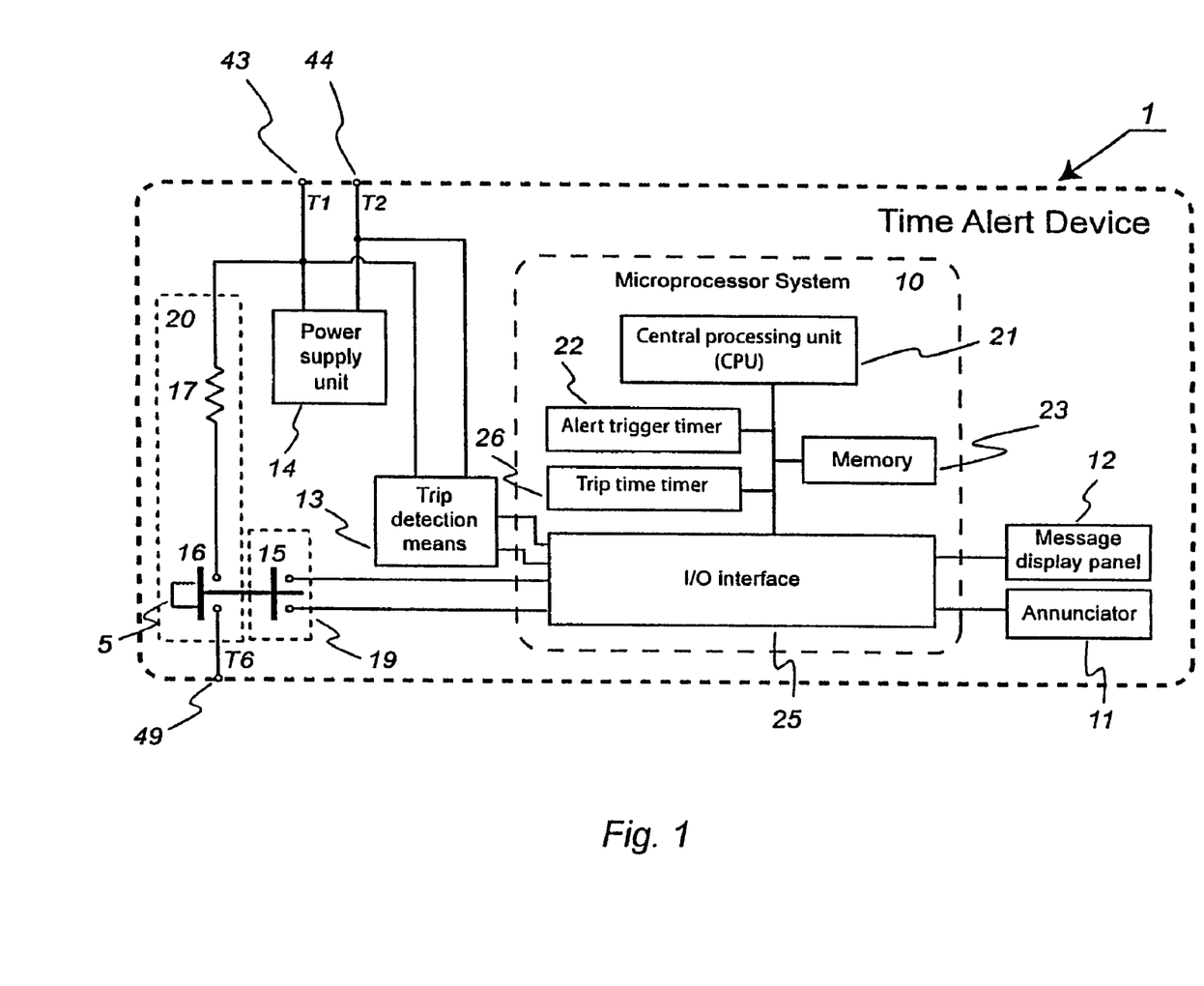
FIG. 1 is a block diagram of one embodiment of the time alert device of this invention wherein the tripping switch of the tripping initiation circuit and the test detection switch of the test detection means are the contacts of a manually operated test button.
Figure 2:
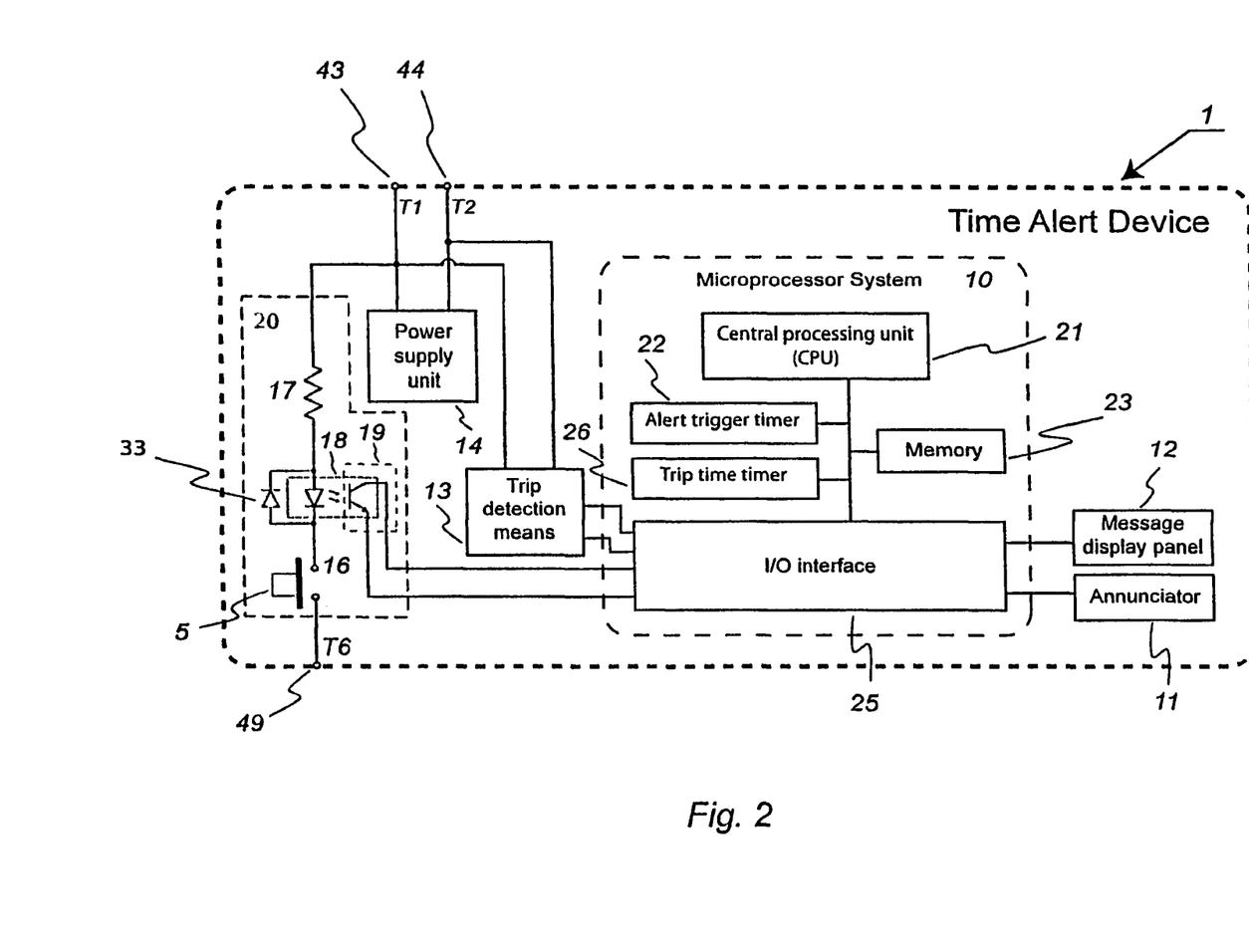
FIG. 2 is a block diagram of another embodiment of the time alert device of this invention wherein the tripping switch of the tripping initiation circuit is the contacts of a manually operated test button and wherein the test detection means is the output of an opto-coupler electrically interlocked to the tripping switch.
Figure 9:
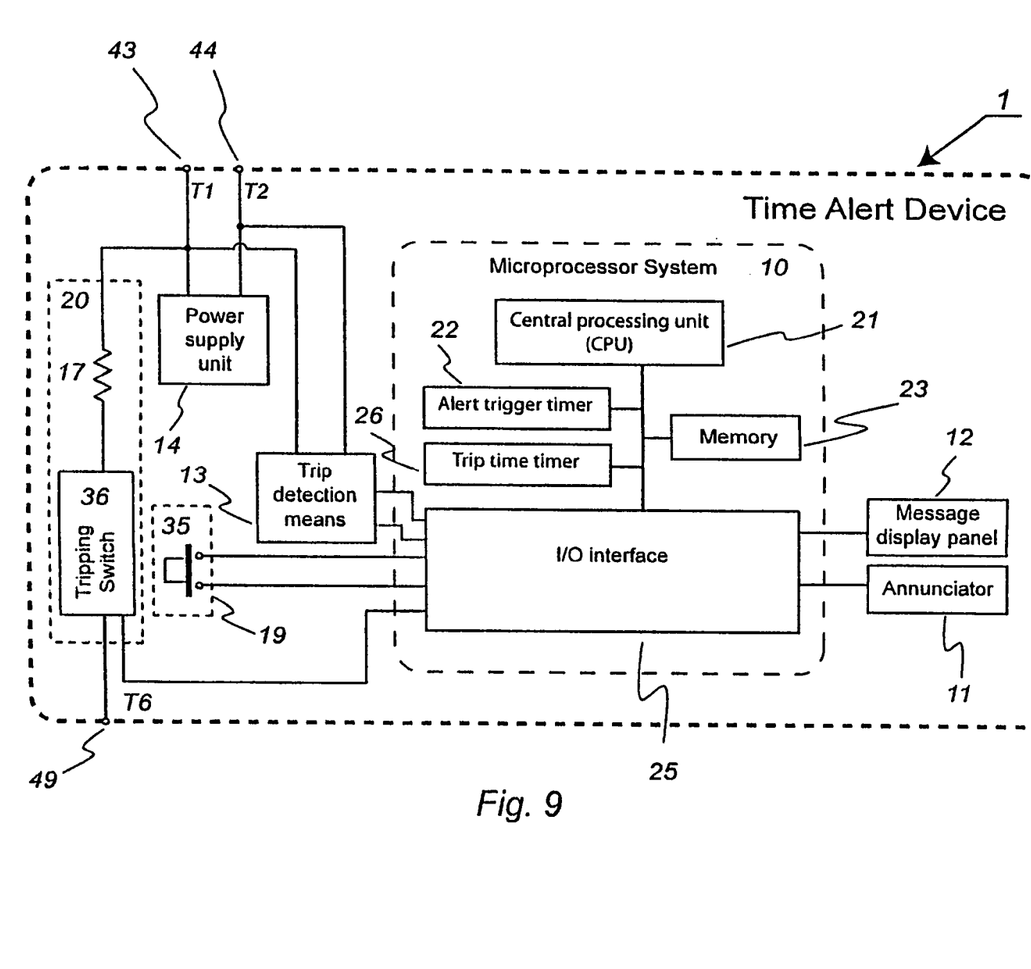
FIG. 9 is a block diagram of another embodiment of the time alert device of this invention wherein the tripping switch of the tripping initiation circuit closes in respond to a switching on command from the microprocessor system and the test detection means is a manually operated test button.

Referring to FIGS. 1, 2 and 9, the time alert device (1) comprises a microprocessor system (10), trip detection means (13), an annunciator (11), a tripping initiation circuit (20), test detection means (19), a power supply unit (14) and terminals T1, T2 and T6 (43, 44 and 49) providing means for connecting the time alert device (1) to the Live, Neutral and Earth wires of the electrical installation zone protected by the earth leakage protection device. The time alert device (1) can be further provided with a message display panel (12).

The microprocessor system (10) comprises a central processing unit (CPU) (21), a memory (23), volatile and non-volatile, an alert trigger timer (22) and an I/O interface (25). In another embodiment, the microprocessor system (10) can be further provided with a trip time timer (26). The CPU (21) is the brain of the microprocessor system (10) and executes pre-programmed instructions residing in the memory (23) for the proper functioning of the time alert device (1). The alert trigger timer (22) and the optional trip time timer (26) are software controlled timers with their timing and logic controlled by the CPU (21) of the microprocessor system (10).

The trip detection means (13) is a circuit or device to detect if the earth leakage protection device (2 or 6) did trip when a user of the earth leakage protection device (2 or 6) performs integrity test on the earth leakage protection device (2 or 6). The trip detection means (13) can be a voltage sensor for sensing the voltage across the live and neutral wires of the electrical installation zone protected by the earth leakage protection device (2 or 6) or a current sensor for sensing indirectly the voltage across the live and neutral wires of the electrical installation zone protected by the earth leakage protection device (2 or 6). In operation, this is accomplished by connecting the input terminals T1 and T2 (43 and 44) of the time alert device (1) to the live and neutral wires of the electrical installation zone. The output of the trip detection means (13) is interfaced to the microprocessor system (10) through the I/O interface (25) to enable the microprocessor system (10) to continually sample the output of the trip detection means (12).

The annunciator (11) provides visible and audible alerting signals to the user of the earth leakage protection device (2 or 6) to perform integrity test on the earth leakage protection device (2 or 6) at a preset time interval. The annunciator (11) is electrically connected to the microprocessor system (10) through I/O interface (25) of the microprocessor system (10) to allow the microprocessor system (10) to control the turning on and turning off of the visible and audible alerting signals. The annunciator (11) consists of at least a speaker or buzzer or other forms of devices capable of generating an audible warning sound or voice and/or a visual indicator to alert the user to perform an integrity test on the earth leakage protection device (2 or 6) as and when the alert trigger timer (22) of the microprocessor system (10) timed-out as described later.

The message display panel (12) can be optionally provided and when provided it is interfaced to the microprocessor system (10) via the I/O interface (25) to allow the microprocessor system (10) to display written instructions to the user of the earth leakage protection device (2 or 6) on the actions that should be taken. The message display panel (12) is capable of displaying static or scrolling messages. These messages include instructions to the user of the earth leakage protection device (2 or 6) on the purpose of the annunciations and the actions needed from the user. In the case of a failed test, a message could appear to advise the user accordingly and ask the user to seek expert assistance. These messages are pre-defined and pre-stored in the memory (23) of microprocessor system (10).

The tripping initiation circuit (20) enables the user of the earth leakage protection device to intentionally generate an earth leakage current, during performance of integrity test, to trip the earth leakage protection device (2 or 6) and the detection enabling means (19) is a device or circuit connected to the microprocessor system (10) to enable the microprocessor system (10) determines that the user has performed an integrity test on the earth leakage protection device (2 or 6). Once the microprocessor system (10) determines that an integrity test had been performed, the microprocessor system (10) will compare the output of the trip detection means (13) as sampled after a predefined time delay, being at least the longest of the prescribed tripping time of the earth leakage protection device (2 or 6), to the rated voltage to determine if the earth leakage protection device (2 or 6) trips as it should if the earth leakage protection device is functioning properly.

Referring now to FIG. 1 only, in one embodiment of the tripping initiation circuit (20) and the test detection means (19), the tripping initiation circuit (20) comprises a tripping switch (16) connected in series with a current limiting resistor (17) with the ends of the tripping initiation circuit (20) connected in use to the live and neutral wires of the electrical installation zone protected by the earth leakage protection device (2 or 6) via terminals T1 (43) and T6 (49) of the time alert device (1) and the test detection means (19) is a test detection switch (15). The tripping switch (16) in the tripping initiation circuit (20) is the first pair of contacts of a manually operated test button (5) while the test detection switch (15) is the second pair of contacts of the test button (5). The test detection switch (15) is mechanically or electrically interlocked or both mechanically and electrically interlocked with the tripping switch (16) and with the ends of the test detection switch (15) electrically interfaced to the microprocessor system (10) via the I/O interface (25) of the microprocessor system (10). The value of the current limiting resistor (17) of the tripping initiation circuit (20) is determined by the sensitivity of the earth leakage protection device (2 or 6). When the time alert device (1) is connected in use to the electrical installation zone protected by the earth leakage protection device (2 or 6), the actuation of the test button (5) closes the tripping switch (16), completing the circuit path from live wire to earth wire and thereby intentionally generating a leakage current through the current limiting resistor (17) to earth to trip the earth leakage protection device (2 or 6). At the same time, the actuation of the test button (5) changes the state of the test detection switch (15). When the microprocessor system (10) detects a change in the state of the test detection switch (15), the microprocessor system (10) determines that the user has performed an integrity test on the earth leakage protection device (2) and the microprocessor system (10) will then sample the output of the trip detection means (13) after a predefined time delay to determine if the integrity test is successful. As described earlier, the predefined time delay is provided to avoid the microprocessor system (10) from testing an output value of the trip detection means (13) before the tripping of the earth leakage protection device (2 or 6). Certain predetermining conditions must be satisfied for the microprocessor system (10) of the time alert device (1) to recognize the integrity test as being successful. These predetermining conditions shall be described later.

Referring now to FIG. 2 only, in another embodiment of the tripping initiation circuit (20) and test detection means (19), the tripping initiation circuit (20) comprises a tripping switch (16), a current limiting resistor (17) and an opto-coupler (18) connected in series with the ends of the tripping initiation circuit (20) connected in use to the live and neutral wires of the electrical installation zone protected by the earth leakage protection device (2 or 6) via terminals T1 (43) and T6 (49) of the time alert device (1) and the test detection means (19) is the output of the opto-coupler (18) with the ends of the output of the opto-coupler (18) electrically interfaced to the microprocessor system (10) via the I/O interface (25) of the microprocessor system (10). The tripping switch (16) in the tripping initiation circuit (20) is the pair of contacts of a manually operated test button (5). The value of the current limiting resistor (17) of the tripping initiation circuit (20) is determined by the sensitivity of the earth leakage protection device (2 or 6). In this configuration, the output of the opto-coupler (18) is electrically interlocked to the tripping switch (16). The opto-coupler (18) of the tripping initiation circuit (20) can be further provided with a reversed biased diode (33) to protect the opto-coupler (18) against reverse potential during each half cycle of AC supply. The opto-coupler (18) and the reversed biased diode (33) can be substituted with a commercially available opto-coupler provided with reversed biased diode as an integral unit. When the time alert device (1) is connected in use to the electrical installation zone protected by the earth leakage protection device (2 or 6), the actuation of the manually operated test button (5) closes the tripping switch (16), completing the circuit path from live wire to earth wire and thereby intentionally generating a leakage current through the current limiting resistor (17) to earth to trip the earth leakage protection device. The earth leakage current activates the opto-coupler (18) and changes the state of the output of the opto-coupler (18). When the microprocessor system (10) detects a change in the state of the output of the opto-coupler (18), the microprocessor system (10) determines that the user has performed an integrity test on the earth leakage protection device (2) and the microprocessor system (10) will then sample the output of the trip detection means (13) after a predefined time delay to determine if the integrity test is successful. The purpose of the predefined time delay has been described earlier. Certain predetermining conditions must be satisfied for the microprocessor system (10) of the time alert device (1) to recognize the integrity test as being successful. These predetermining conditions shall be described latter.

In yet another embodiment, the opto-coupler in FIG. 2 can be replaced with a solid-state relay to provide test detection means (19) that is also electrically interlocked with the tripping switch (16). In this embodiment, the tripping initiation circuit (20) comprises a tripping switch (16), a current limiting resistor (17) and a solid state relay (not shown) connected in series with the ends of the tripping initiation circuit (20) connected in use to the live and neutral wires of the electrical installation zone protected by the earth leakage protection device (2 or 6) via terminals T1 (43) and T6 (49) of the time alert device (1) and the test detection means (19) is a pair of contacts of the solid state relay with the ends of the contacts of the solid state relay electrically interfaced to the microprocessor system (10) via the I/O interface (25) of the microprocessor system (25). The tripping switch (16) in the tripping initiation circuit (20) is the pair of contacts of a manually operated test button (5). When the time alert device (1) is connected in use to the electrical installation zone protected by the earth leakage protection device (2 or 6), the actuation of the manually operated test button (5) closes tripping switch (16), generating a leakage current to trip the earth leakage protection device. The earth leakage current energises the solid state relay (not shown) and changes the state of the pair of contacts of the solid state relay. When the microprocessor system (10) detects a change in the state of the pair of contacts of the solid state relay, the microprocessor system (10) determines that the user has performed an integrity test on the earth leakage protection device (2) and the microprocessor system (10) will determines if the predetermining condition for a successful integrity test is satisfied, as described earlier, through sampling of the outputs of the trip detection means (13).

Referring now to FIG. 9 only, in yet another embodiment of the tripping initiation circuit (20) and test detection means (19), the tripping initiation circuit (20) comprises a tripping switch (36) connected in series with a current limiting resistor (17) with the ends of the tripping initiation circuit (20) connected in use to the live and neutral wires of the electrical installation zone protected by the earth leakage protection device (2 or 6) via terminals T1 (43) and T6 (49) of the time alert device (1) and the test detection means (19) is a manually operated test button (35) with the ends of the test button (35) electrically interfaced to the microprocessor system (10) via the I/O interface (25) of the microprocessor system (25). The value of the current limiting resistor (17) of the tripping initiation circuit (20) is determined by the sensitivity of the earth leakage protection device (2 or 6). The tripping initiation circuit (20) is interfaced with the microprocessor system (10) through the I/O interface (25) to enable the microprocessor system (10) to deliver a command to the tripping switch (36) of the tripping initiation circuit (20) and wherein the switching on and off of the tripping switch (36) is controlled by the microprocessor system (10).

The preferred embodiments for the tripping switch (36) are an electronic switch and an electromechanical switch. When the time alert device (1) is connected in use to the electrical installation zone protected by the earth leakage protection device (2 or 6), the actuation of the test button (35) enables the microprocessor system (10) determines that the user has performed an integrity test on the earth leakage protection device (2 or 6) and the microprocessor system (10) will deliver a switching-on command to close the tripping switch (36) of the tripping initiation circuit (20) to intentionally generate an earth leakage current through the current limiting resistor (17) to trip the earth leakage protection device (2 or 6). The microprocessor system (10) samples the output of the trip detection means (13) after a predefined time delay to determine if the integrity test is successful. Certain predetermining conditions must be satisfied for the microprocessor system (10) of the time alert device (1) to recognize the integrity test as being successful. These predetermining conditions shall be described latter.

In the case of an electronic switch, the preferred embodiment for the electronic switch is a triac or a solid state relay. In the case of an electromechanical switch, the tripping switch (36) is a pair of normally open contacts of an electromechanical relay.

In the case of electronic switch such as triac or solid state relay, on receiving a switching-on command from the microprocessor system (10), the electronic switch closes, causing earth leakage current to flow through the current limiting resistor (17) to earth to cause the earth leakage protection device to trip.

In the case of electromechanical switch, the pair of normally open contacts of the electromechanical relay that is connected in series with the current limiting resistor closes when the electromechanical relay is energized on receiving a switching-on command from the microprocessor system (10), the closing of the pair of contacts results in earth leakage current flowing through the current limiting resistor (17) to earth. The earth leakage in turn causes the earth leakage protection device (2 or 6) to trip.

Referring again to FIGS. 1, 2 and 9, the time alert timer device (1) is powered by a power supply unit (14) in the form of an AC/DC converter which is connected in use to the live and neutral wires of the electrical installation zone protected by the earth leakage protection device (2 or 3) via the input terminals T1 and T2 (43 and 44) of the time alert device (1). The power supply unit (14) can also be an external battery (not shown). Alternatively, an internal battery (not shown) can be provided to serve as the power supply unit (14) or as a backup to the AC/DA converter in the event that the AC electricity supply is cut off. The battery enables the alert trigger timer (22) to continue time counting even when the power supply of the electrical installation is off for whatever reason. While the battery provides accuracy in time counting, it is not essential as the outage of a power supply for a few hours or even one or two days, although results in slightly delayed integrity test, would not jeopardize the alerting feature intention of this invention.

Figure 3:
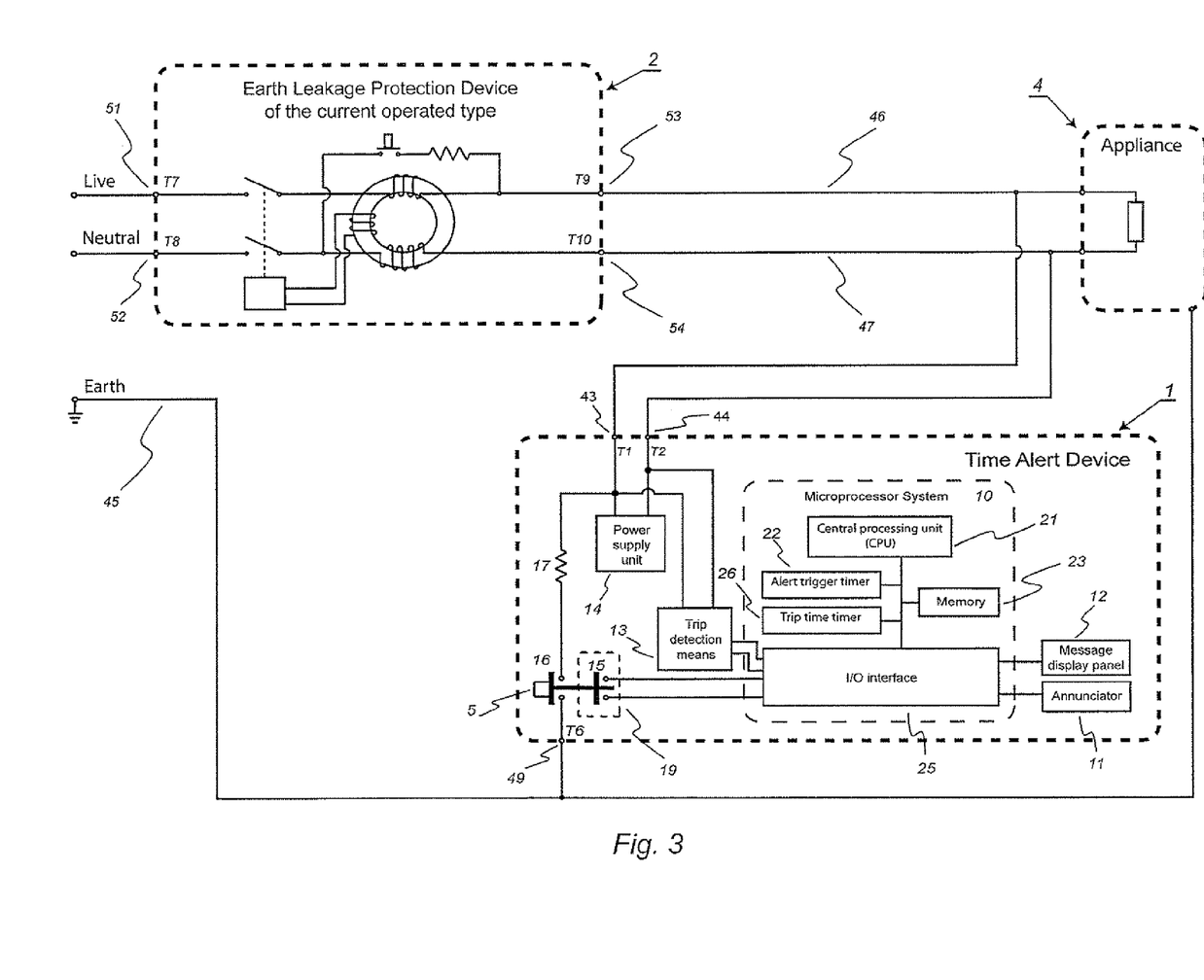
Figure 4:
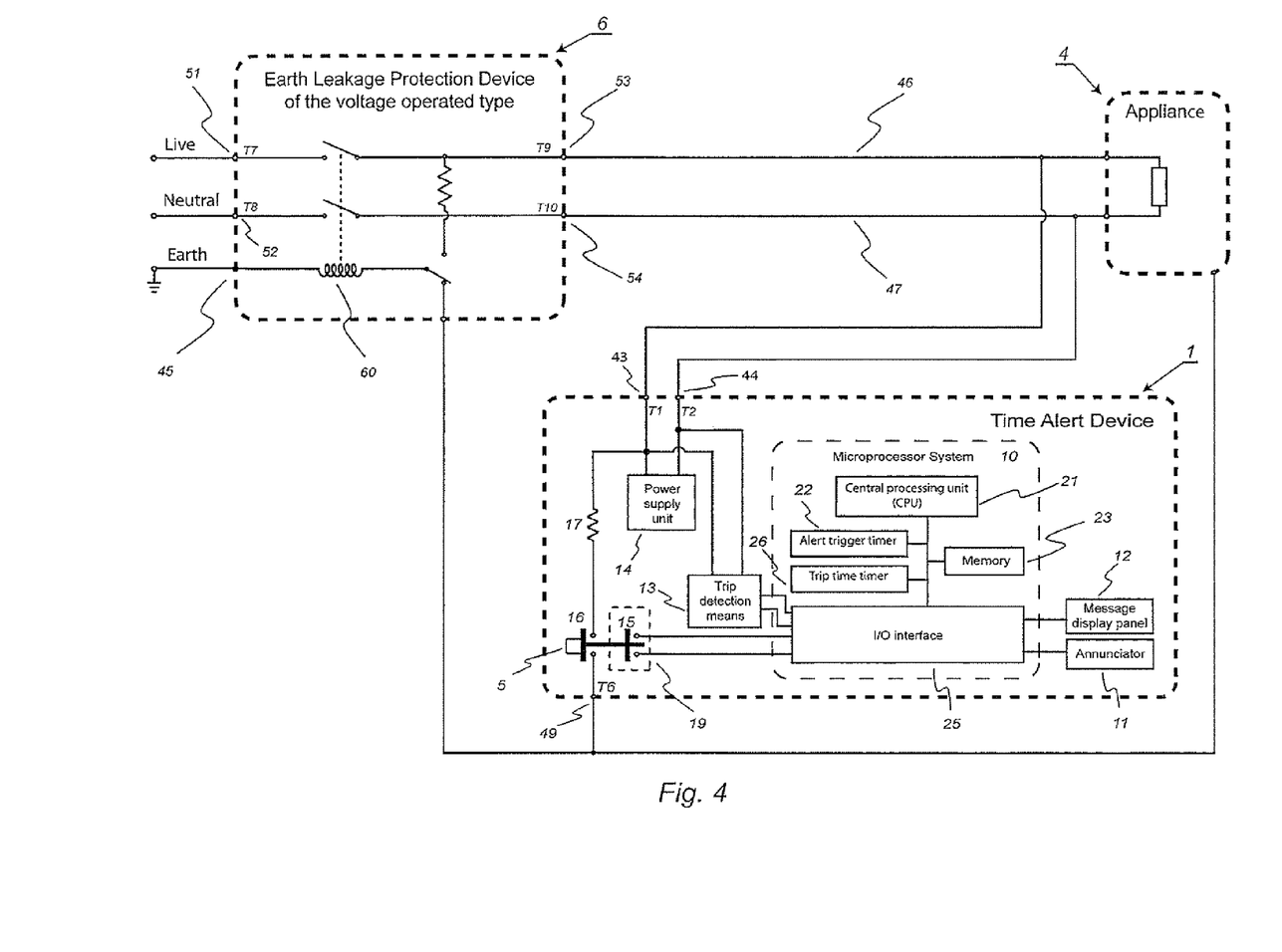

FIGS. 3 and 4 show the wiring arrangement of the time alert device (1) when in use. In use, the input terminals T1 and T2 (43 and 44 respectively) of the time alert device (1) are connected respectively to the live and neutral wires (46 and 47 respectively of FIGS. 3 and 4) on the load side of the earth leakage protection device (2 or 6) of the electricity electrical installation zone for the power supply unit (14), if the power supply unit (14) is an AC/DC converter, to receive the requisite AC power supply and for the trip detection means (13) to detect tripping of the earth leakage protection device (2 or 6). In use, the earth terminal (49) of the time alert device (1) is connected to the earth wire (45) in the case of earth leakage protection device (2) of the current operated type (FIG. 3) or to the earth wire (45) via the trip coil (60) of the earth leakage protection device (6) of the voltage operated type (FIG. 4) in the case of earth leakage protection device (6) of the voltage operated type.

Figure 5A:
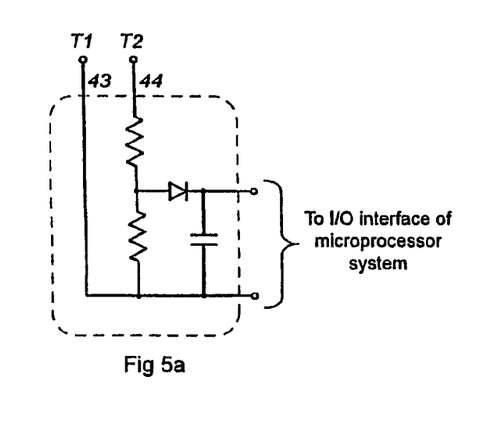
FIGS. 5a, 5b, 5c and 5d are some illustrations of the possible configurations of a voltage sensor.
Figure 5B:
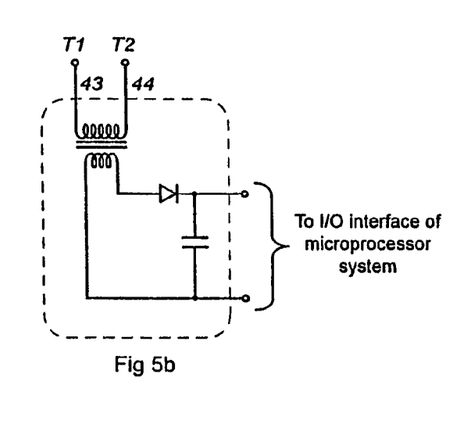
Figure 5C:
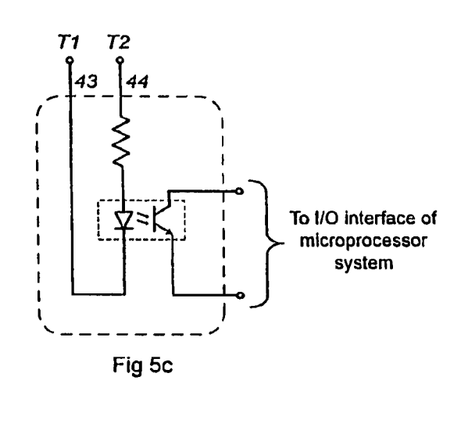
Figure 5D:
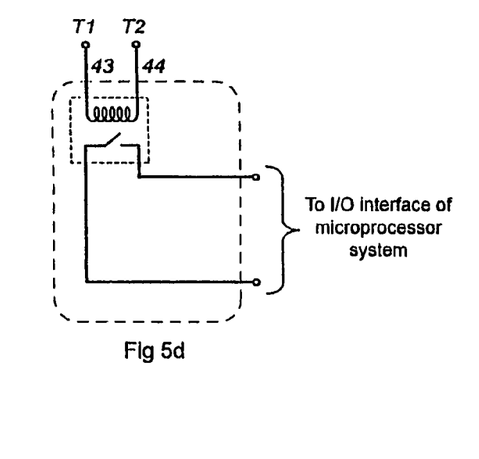

FIGS. 5a to 5d illustrate some of the possible configurations of a voltage sensor. FIG. 5a shows a potential divider circuit with the input connected to the supply lines of the electrical installation zone protected by the earth leakage protection device (2 or 6) and the output interfaced to the microprocessor system (10) via the I/O interface (25). FIG. 5b shows a step down voltage transformer with the input connected to the supply lines and the output interfaced to the microprocessor system (10) via the I/O interface (25). FIG. 5c shows an optically isolated switch or a solid-state relay with the input connected to the supply lines and the output interfaced to the microprocessor system (10) via the I/O interface (25). FIG. 5d shows an AC electromechanical relay with the input connected to the supply lines and with the relay having a pair of contacts interfaced to the microprocessor system (10) via the I/O interface (25), wherein the closing or opening of the contacts is determined by whether there exists a voltage across the input terminals.

Figure 6:
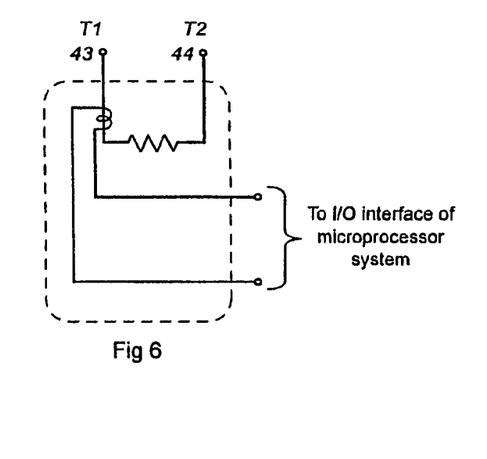
FIG. 6 is an illustration of a possible configuration of a current sensor.

FIG. 6 shows one possible configuration of a current sensor wherein a current transformer measures the current flowing through a shunt resistor connected across the input terminals T1 and T2 (43 and 44) of the earth leakage protection device (2). The output of the current transformer is interfaced to the microprocessor system (10) via the I/O interface (25) to detect the interruption to current flowing through the shunt resistor.

While the above describes the use of microprocessor system in implementing the invention, it is readily understood by someone skilled in the art that the above logic and control sequence can also be achieved through discrete logic circuits and/or analogue circuits or microcontroller.

The operation of the time alert device (1) of this invention when used together with an earth leakage protection device (2) of current operated type will now be described with reference to FIGS. 3, 7 and 8.

Initially, when the time alert device (1) is energized (step 100 of FIG. 7 or 8) the alert trigger timer (22) of the microprocessor system (10) is reset to the initial condition for commencement of time counting (step 101). When the alert trigger timer (22) timed-out (step 102) on the lapse of a preset time, the microprocessor system (10) initiates audio reminder or audio and visual reminders to the user through the annunciator (11) (step 104) reminding the user to perform an integrity test on the earth leakage protection device (2). The audio and visual reminders may include a flashing indicator, a short intermittent beeping sound or a voice message to inform the user on the purpose of the audio annunciation and the action that should be taken by the user or a combination of these reminders. In the case of a time alert device (1) provided with an optional message display panel (12), a pre-stored message will be sent simultaneously by the microprocessor system (10) via the I/O interface (25) to the message display panel (12) to display the purpose of the reminders and the action that should be taken by the user (step 105). With this dual-indication means even the deaf or visually handicapped users can be alerted. Step 105 will be skipped in the case of time alert device not provided with the optional message display panel (12).

To perform an integrity test on the earth leakage protection device (2), the user presses the test button (5). The actuation of the test button (5) closes the tripping switch (16). The closing of the tripping switch (16) completes the circuit path from live wire to earth wire and thereby intentionally generates an earth leakage current through the current limiting resistor (17) to the earth wire (45). The earth leakage current will result in a differential current between the live and neutral wires on the load side of the earth leakage protection device (2) as seen by the earth leakage protection device (2). This differential current will cause the earth leakage protection device (2), if it is functioning properly, to trip the electricity supply to its output terminals T9 and T10 (53 and 54 FIG. 3), thereby testing the integrity of the earth leakage protection device (2).

As described earlier, the actuation of the test button (5) simultaneously changes the state of the test detection switch (15) and when the microprocessor system (10) of the time alert device (1) detects a change in the state of the test detection switch (15) (step 106), the microprocessor system (10) determines that the user has performed an integrity test on the earth leakage protection device (2) and on the earth wire (45). The microprocessor system (10) will in turn determine if the predetermining condition or conditions for a successful integrity test are met and resets the alert trigger timer (22), the annunciators (11) and the message display panel (12), if one is provided, if the integrity test is successful. In the case of a time alert device (1) provided with an alert trigger timer (22) but not a trip time timer (26) (FIG. 7), one predetermining condition must be satisfied for the time alert device (1) to recognize that the integrity test as being successfully completed. The predetermining condition is the detection by the time alert device (1) of an interruption in the AC electricity supply (step 109) after a predefined time delay (step 107 FIG. 7) from the detection of the performance of the integrity test (step 106), in this case from the time of detection of a change in the state of the test detection switch (15). The predefined time delay (step 107) should be at least the longest of the prescribed tripping time range of the earth leakage protection device (2). This predefined time delay (step 107) is provided to avoid the microprocessor system (10) testing the output value of the trip detection means (13) before the earth leakage protection device (2) trips. Otherwise, the microprocessor system (10) may erroneously interpret that the earth leakage protection device (2) fails to trip. After the lapse of the predefined time delay, the microprocessor system (10) tests the output of the trip detection means (13) and compares the value of the output to the rated voltage to determine if the earth leakage protection device (2) has tripped and interrupted the AC supply.

The trip detection means (13) could be a voltage sensor or a current sensor. If the load or appliance coupled to the earth leakage protective device (2) is an inductive load, the voltage or current may take time to decay after interruption of electricity supply. As a result, if the trip detection means (13) used is a voltage sensor or a current sensor, the voltage sensor or the current sensor will continue to detect a voltage or current respectively immediately after the tripping of the earth leakage protection device (2). For the measurement of tripping time, the method of which shall be described later, this post a problem to the accuracy of the tripping time measured. To ensure the tripping time is accurate enough, on actuation of the test button (5), a sampled test voltage of typically 85% or below the rated voltage is interpreted as that the earth leakage protection device (2) has tripped.

In the case of a time alert device (1) provided with an alert trigger timer (22) and a trip time timer (26) (FIG. 8), two predetermining conditions must be satisfied for the time alert device (1) to recognize that the integrity test as being successfully completed. These predetermining conditions include the precondition described earlier and a second predetermining condition. The second predetermining condition is that the trip time of the earth leakage protection device (2) as measured by the time alert device (1) must be within a prescribed tripping time range (Step 110) typically 30 ms to 200 ms, depending on the sensitivity of the earth leakage protection device (2) and the leakage current. The measurement of the trip time of the earth leakage protection device (2) will now be described. The actuation of the test button (5) changes the state of the test detection switch (15) and on detecting the performance of an integrity test, the CPU (21) of the microprocessor system (10) initiates time counting by the trip time timer (26). The microprocessor system (10) continuously samples the output of the trip detection means (13) for a confirmation of the tripping of the earth leakage protection device (2), the output of the trip detection means (13) being interfaced via I/O interface (25) to the microprocessor system (10). The necessary indication for a confirmation of the tripping of the earth leakage protection device depends on the type of the trip detection means (13) adopted. As described earlier, a test voltage of typically 85% or less compared to the rated voltage would be interpreted as that the earth leakage protection device (2) has tripped. Upon detection of the tripping of the earth leakage protection device (2), the CPU (21) of the microprocessor system (10) immediately halts time counting by the trip time timer (26). The trip time as measured by the trip time timer (26) is compared against the prescribed tripping time range of the earth leakage protection device as stored in the memory (23) of the microprocessor system (10) to determine if the earth leakage protection device (2) breaks within the prescribed tripping time range for that particular made or model.

Figure 7:
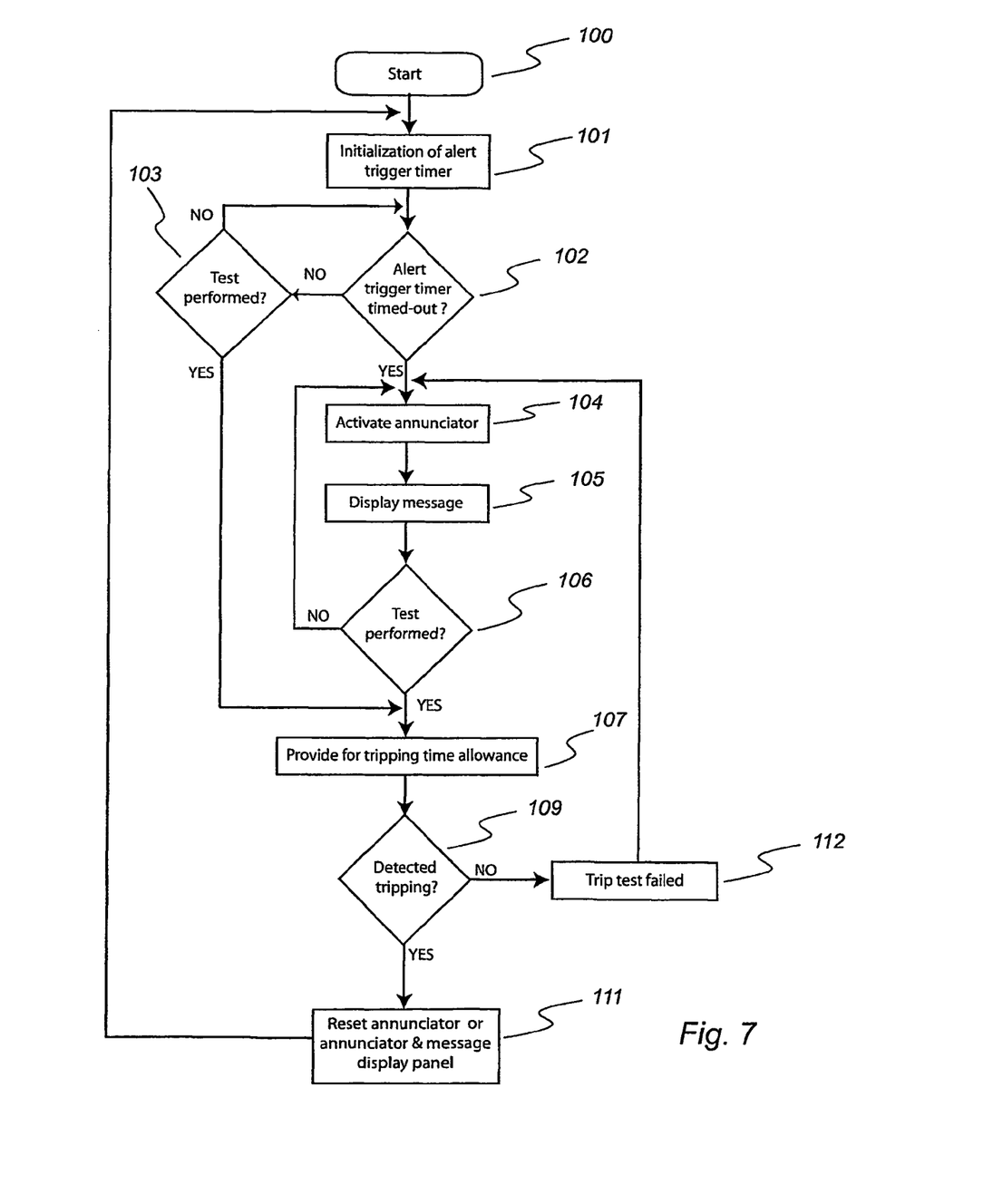
FIG. 7 is a flow chart showing the flow sequence on the operation of the time alert device of this invention provided with an alert trigger timer but not a trip time timer.
Figure 8:
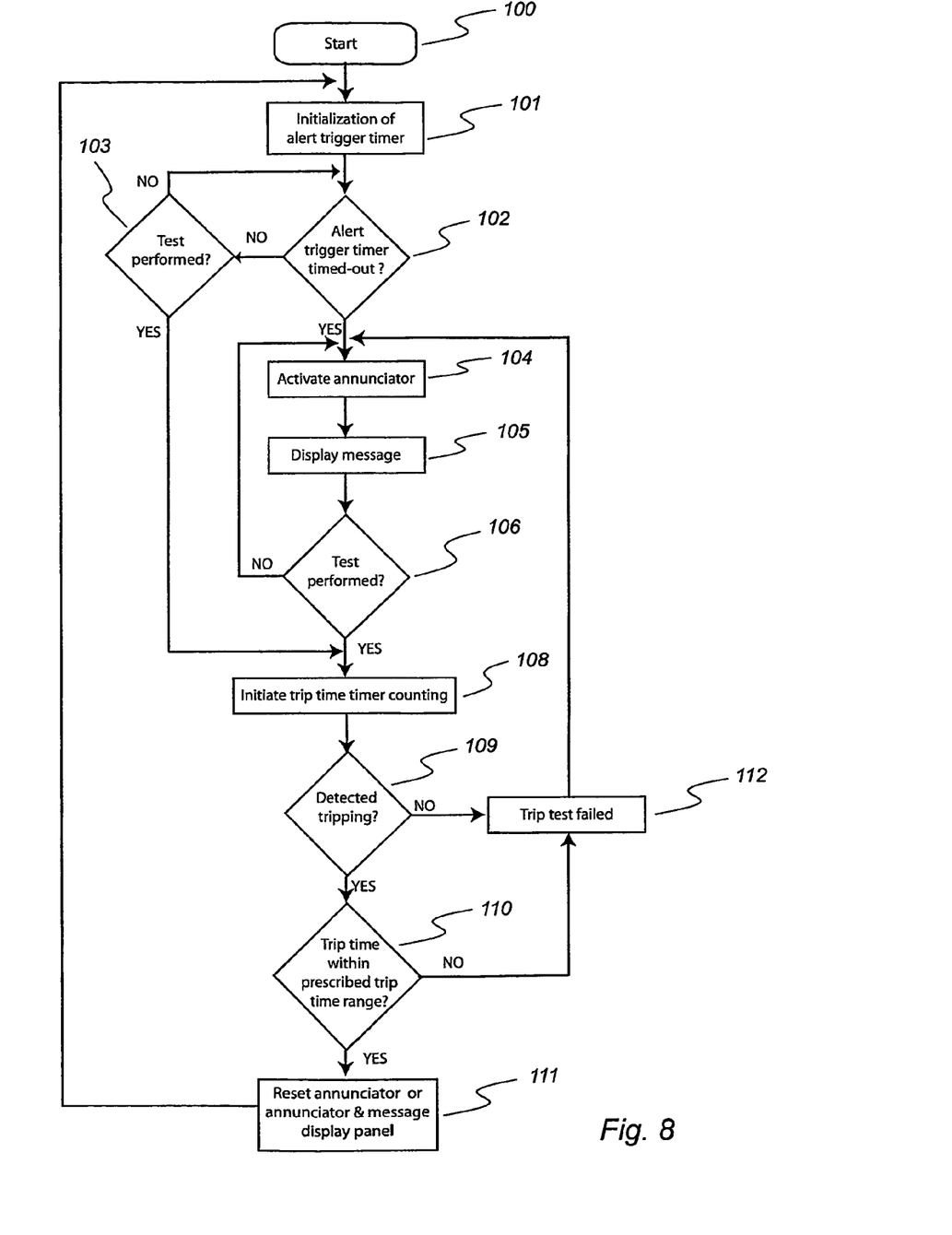
FIG. 8 is a flow chart showing the flow sequence on the operation of the time alert device of this invention provided with both an alert trigger timer and a trip time timer.

Once the predetermining condition or conditions are met, the microprocessor system (10) resets the annunciator (11) and the message display panel (12) (if one is provided) (step 111 FIGS. 7 and 8). The microprocessor system (10) also resets or initializes the software controlled alert trigger timer (22) for the next test cycle time (step 101).

In the case of a time alert device (1) with only the alert trigger timer (22), if the microprocessor system (10) detects a change in the state of the test detection switch (15) but not a confirmation of the tripping of the earth leakage protection device, it interprets this condition as a failed test (Step 112 FIG. 7) and the earth leakage protection device (2) of current operated type is deemed faulty.

In the case of a time alert device (1) provided with both the alert trigger timer (22) and the trip time timer (26), the two predetermining conditions described earlier must be met or else the microprocessor system (10) interprets the test as a failed test (Step 112 FIG. 8) and the earth leakage protection device of (2) current operated type is deemed faulty.

Although FIG. 3 relates to the embodiment where the tripping initiation circuit (20) comprises a tripping switch (16) and a current limiting resistor (17) connected in series and the test detection means (19) is a test detection switch (15) mechanically or electrically interlocked or both mechanically and electrically interlocked to the tripping switch (16), the description above could be readily adapted for other embodiments. For instance, in the embodiment where the tripping initiation circuit (20) comprises a tripping switch (16), a current limiting resistor (17) and an opto-coupler (18) connected in series and the test detection means (19) is the output of the opto-coupler (18), the difference with the embodiment as described above resides in the test detection means (19) that enables the microprocessor system (10) determines when the user performs an integrity test on the earth leakage protection device (2). In the earlier embodiment, the test detection means (19) is the test detection switch (15) mechanically or electrically interlocked or both mechanically and electrically interlocked to the tripping switch (16) and wherein the test detection switch (is) and the tripping switch (16) are contacts of the test button (5). In the later embodiment the test detection means (19) is the output of the opto-coupler which is electrically interlocked to the tripping switch (16) which is the pair of contacts of the test button (5). The same description could be readily adapted for the embodiment where the tripping initiation circuit (20) comprises a tripping switch (16), a current limiting resistor (17) and a solid state relay connected in series and the test detection means (19) is a pair of contacts of the solid state relay and wherein the tripping switch (16) is a pair of contacts of the test button (5). In this solid state relay embodiment, the pair of contacts of the solid state relay is electrically interlocked to the tripping switch (16). The description on the operation sequence for these two embodiments is therefore not repeated here.

The operation of the time alert device (1) with the embodiment where the switching on and off of the tripping switch (36) in the tripping initiation circuit (20) is controlled by the microprocessor system (10) as shown in FIG. 9, when used together with an earth leakage protection device (2) of current operated type are the same as that for the embodiment of FIG. 1 and will now be briefly described with reference to FIGS. 7, 8 and 9.

Initially, when the time alert device (1) is energized (step 100 of FIG. 7 or 8) the alert trigger timer (22) of the microprocessor system (10) is reset to the initial condition for commencement of time counting (step 101). When the alert trigger timer (22) timed-out (step 102) on the lapse of a preset time, the microprocessor system (10) initiates audio reminder or visual and audio reminders to the user through the annunciator (11) (step 104) reminding the user to perform an integrity test on the earth leakage protection device (2).

In the case of a time alert device (1) provided with the optional message display panel (12), a pre-stored message will be sent simultaneously by the microprocessor system (10) via the I/O interface (25) to the message display panel (12) to display the purpose of the reminders and the action that should be taken by the user (step 105).

To perform an integrity test on the earth leakage protection device (2), the user actuates the test button (35). The actuation of the test button (35) enables the microprocessor system (10) to determine that the user has performed an integrity test on the earth leakage protection device (2) (step 106) and the microprocessor system (10) will deliver a switching-on command to close the tripping switch (36) of the tripping initiation circuit (20) to intentionally generate a leakage current through the current limiting resistor (17) to earth to trip the earth leakage protection device (2). The tripping switch (36) may be an electronic switch such as triac or solid state relay or an electromechanical switch as described earlier. In the case where the microprocessor system (10) is provided with only the alert trigger timer (22), the microprocessor system (10) tests the output of the trip detection means (13) after a predefined time delay (step 107) against the rated voltage to determine if the integrity test is successful. The purpose of the predefined time delay has been described earlier. The predetermining condition (steps 109) that must be satisfied for the microprocessor system (10) of the time alert device (1) to recognize the integrity test as being successful has been described earlier. In the case where the microprocessor system (10) is further provided with a trip time timer (26), on determining that the user has performed an integrity test on the earth leakage protection device (2) (step 106), the microprocessor system (10) initiates time counting by the trip time timer (26) to determine the satisfaction of the second predetermining condition (step 110) described earlier.

Once the predetermining condition or conditions are met, the microprocessor system (10) resets the annunciator (11) and the message display panel (12) (if one is provided) (step 111 FIGS. 7 and 8). The microprocessor system (10) also resets or initializes the software controlled alert trigger timer (22) for the next test cycle time (step 101).

In the case of a time alert device (1) with only the alert trigger timer (22), if the microprocessor system (10) detects a change in the state of the test detection switch (15) but not a confirmation of the tripping of the earth leakage protection device, it interprets this condition as a failed test (Step 112 FIG. 7) and the earth leakage protection device (2) of current operated type is deemed faulty.

In the case of a time alert device (1) provided with both the alert trigger timer (22) and the trip time timer (26), the two predetermining conditions described earlier must be met or else the microprocessor system (10) interprets the test as a failed test (Step 112 FIG. 8) and the earth leakage protection device of (2) current operated type is deemed faulty.

In all the embodiments described above, in the event of a failed test, the audiovisual alerts from the annunciator (11) continue and the alert trigger timer (22) will not be reset. Where the time alert device (1) is optionally provided with a message display panel (12), the CPU (21) of the microprocessor system (10) shall, in a failed test, causes a pre-stored message in the memory (23) to be sent to the message display panel (12) via the I/O interface (25) of the microprocessor system (10) advising the user of a failed integrity test and that expert attention on the earth leakage protection device (2) is needed immediately.

In another situation, if the microprocessor system (10) detects an AC electricity supply interruption without detecting a change in state in the test detection switch (15), it interprets this condition as a normal power failure thus maintaining the present state of the system and no annunciation would be triggered.

In yet another situation, if the microprocessor system (10) detects an absence of voltage across the supply lines connected to the output of the earth leakage protection device (2 or 6) before actuation of the test button (5), it ignores the test and in the case where a message display panel (12) is provided and a battery is provided as a power supply, a message could be displayed to advise the user that the test is ineffective as there is no power on the supply line.

The user of the earth leakage protection device (2) may perform an integrity test on the earth leakage protection device (2) at any time before the alert trigger timer (22) timed-out by completing the circuit path to earth of the tripping initiation circuit (20). This is achieved by pressing the test button (5 or 35) (step 103). When the microprocessor system (10) detects a change in state of the test detection switch (15 FIGS. 1 and 2) or the test button (35 FIG. 9), the microprocessor system (10) tests and monitors the output of the trip detection means (13) to determine the satisfaction of the predetermining condition or conditions, as is appropriate, as described earlier, before resetting the alert trigger timer (22), the annunciator (11) and message display panel (12) if one is provided (step 111 FIGS. 7 and 8). The operation flow sequence in the event of a failed test has been described earlier and is not repeated here.

The time alert device (1) of this invention can also be used together with an earth leakage protection device (6) of voltage operated type. For illustration purposes, the embodiment as in FIG. 1, is used but the operation sequence is the same as that of other embodiments. The interconnections in this configuration between the time alert device (1) of this invention, the appliance and the earth leakage protection device (6) for which the time alert device is to be used together with is shown in FIG. 4. The operation of the time alert device (1) of this invention when used together with earth leakage protection device (6) is the same as that described earlier for earth leakage protection device (2) of current operated type except that the actuation of the test button (5) closes the tripping switch (16), causing a current to flow through the trip coil (60 FIG. 4) of the earth leakage protection device (6) of voltage operated type via the closed tripping switch (16) and the current limiting device (17), thereby tripping the earth leakage protection device (6), thus testing the integrity of the earth leakage protection device (6). The operation sequence is the same as that described for earth leakage protection device (2) of current operated type and the description on the operation sequence shall therefore not be repeated here.

In actual application, the time alert device (1) of FIG. 1, 2 or 9 can be packaged as a switch panel with a casing which is mountable on a wall or a fixture in the same manner as an on-off switch for an electrical supply installation, with the input terminals T1, T2 and T6 (43, 44 and 49) of the time alert device appropriately wired to the live, neutral and earth wires of the electrical installation zone protected by the earth leakage protection device (2 or 6) through the three terminals typical found in a switch panel. The indicators such as annunciator and message display panel together with the test button (5 or 35) are preferably positioned on the front surface of the switch panel. The time alert device (1) can also be packaged as a DIN rail mounted device as per DIN 46277 and DIN EN 50022 that are mountable in a distribution switchboard in the same manner as that of a conventional earth leakage protection device or miniature circuit breaker and the like with input terminals T1, T2 and T6 (43, 44 and 49) of the time alert device appropriately wired to the live, neutral and earth wire of the electrical installation zone protected by the earth leakage protection device (2 or 6) through the terminals of the DIN railed mounted device. The indicators such as annunciator and message display panel together with the test button (5 or 35) are preferably positioned on the front surface of the DIN rail mounted device.

Alternatively, the time alert device (1) as shown in FIG. 1, 2 or 9 can be packaged as a device with three prongs akin to that of a three-prong electrical plug. In this configuration, input terminals T1 and T2 (43 and 44 respectively) of the time alert device (1) are electrically connected to the live pin and the neutral pin and terminal T6 (49) is electrically connected to the earth pin of the three-pin plug. The indicators such as annunciator and message display panel are preferably placed on the front surface of the three-prong plug while the test button (5 or 35) is preferably positioned at a more obscure edge of the three prong package to minimize accidental actuation of the test button (5 or 35). The time alert device (I) with this package should stay plugged into any matching electrical socket if the time alert device (1) is only provided with a AC/DC converter as a power supply unit (14). In the case where the power supply unit (14) is a battery or if battery is provided as a back up to AC/DC converter, the user can choose to plug the time alert device (1) into any matching electrical socket within the electrical installation zone protected by the earth leakage protection device (2 or 6) only at the time of testing on integrity of the earth leakage protection device (2 or 6) or when the annunciator (11) is triggered on time-out of the alert trigger timer (22) of the microprocessor system (10) to remind the user to perform the integrity test.

Alternatively, the time alert device (1) of FIG. 1 can also be built into an appliance (4). The time alert device (1), when built into an appliance (4), is able to test both the earth leakage protection device (2 or 6) and the earth wiring connection (45) between the earth leakage protection device (2 or 6) and the appliance (4).

Although only a few exemplary embodiments of the present invention have been described in detail above, those skilled in the art will readily appreciate that many modifications are possible in the exemplary embodiments above without materially departing from the novel teachings of this invention. Accordingly, all such modifications are intended to be included within the scope of this invention as defined in the following claims or equivalent thereof.

The invention claimed is:

1. A time alert device (1) for use with an earth leakage protection device installed in an electrical installation zone to remind the user of an earth leakage protection device to perform an integrity test on the earth leakage protection device, said electrical installation zone including live and neutral wires and an earth wire and said time alert device being packaged separately from the earth leakage protection device, said time alert device comprising:
  a microprocessor system (10) comprising a CPU (21), a memory (23), an alert trigger timer (22) and an I/O interface (25);
  at least one annunciator (11) electrically connected to the I/O interface (25) of the microprocessor system (10);
  a tripping initiation circuit (20) comprising a current limiting resistor (17) connected in series with a tripping switch (16 or 36) between the live and earth wires of the electrical installation zone to enable the user of the earth leakage protection device to intentionally generate an earth leakage current during performance of integrity test;
  test detection means (19) to enable the microprocessor system (10) to determine that the user has performed an integrity test on the earth leakage protection device;
  trip detection means (13) to enable the microprocessor system (10) to determine the tripping of the earth leakage protection device;
  means for connecting the trip detection means (13) to the live and neutral wires of the electrical installation zone protected by the earth leakage protection device, said connection of
  the trip detection means to the live and neutral wires of the electrical installation zone being outside the earth leakage protection device; and
  means for receiving and applying power supply to the time alert device (1);
  wherein the microprocessor system (10) activates the at least one annunciator (11) to alert the user to perform an integrity test on the earth leakage protection device when the alert trigger timer (22) of the microprocessor system (10) has timed out; and wherein the time alert device (1) recognizes the integrity test as being successful if and only if the microprocessor system (10) of the time alert device (1) determines, through the test detection means (19), that the user has performed an integrity test and subsequently determines, through the trip detection means (13), that the earth leakage protection device has tripped.

2. A time alert device (1) to remind the user of an earth leakage protection device to perform an integrity test on the earth leakage protection device as in claim 1, wherein the microprocessor system (10) is further provided with a trip time timer (26) to measure the tripping time of the earth leakage protection device; and wherein the microprocessor system (10) of the time alert device (1) only recognizes the integrity test as being successful if and only if the microprocessor system (10) of the time alert device (1) determines, through the test detection means (19), that the user has performed an integrity test and thereafter determines, through the trip timer (26), that the earth leakage protection device tripped within a predefined tripping time stored in the memory (23) of the microprocessor system (10).

3. A time alert device (1) to remind the user of an earth leakage protection device to perform an integrity test on the earth leakage protection device as in claim 2, wherein the annunciator (11) is audible and/or visible.

4. A time alert device (1) to remind the user of an earth leakage protection device to perform an integrity test on the earth leakage protection device as in claim 2, wherein the microprocessor system (10) resets the annunciator (11) and/or the alert trigger timer (22) only on a successful integrity test on the earth leakage protection device.

5. A time alert device (1) to remind the user of an earth leakage protection device to perform an integrity test on the earth leakage protection device as in claim 2, wherein the tripping switch (36 FIG. 9) in the tripping initiation circuit (20) is an electronic switch; and wherein the electronic switch is switched on by a switching-on command from the microprocessor system (10), the switching on command being delivered to the electronic switch once the microprocessor system (10) determines, through the test detection means (19), that the user has performed an integrity test on the earth leakage protection device, and wherein the closing of the electronic switch completes the circuit path to earth, thereby intentionally generating an earth leakage current to trip the earth leakage protection device.

6. A time alert device (1) to remind the user of an earth leakage protection device to perform an integrity test on the earth leakage protection device as in claim 1, wherein the annunciator (11) is audible and/or visible.

7. A time alert device (1) to remind the user of an earth leakage protection device to perform an integrity test on the earth leakage protection device as in claim 1, wherein the microprocessor system (10) resets the annunciator (11) and/or the alert trigger timer (22) only upon a successful integrity test the earth leakage protection device.

8. A time alert device (1) to remind the user of an earth leakage protection device to perform an integrity test on the earth leakage protection device as in claim 1, wherein the tripping switch (36 FIG. 9) in the tripping initiation circuit (20) is an electronic switch; and wherein the electronic switch is switched on by a switching-on command from the microprocessor system (10), the switching on command being delivered to the electronic switch once the microprocessor system (10) determines, through the test detection means (19), that the user has performed an integrity test on the earth leakage protection device, wherein the closing of the electronic switch completes the circuit path to earth, thereby intentionally generating an earth leakage current to trip the earth leakage protection device.

9. A time alert device (1) to remind the user of an earth leakage protection device to perform an integrity test on the earth leakage protection device as in claim 8, wherein the test detection means (19) is a test button (35) with a plurality of electrical contacts, wherein each of the electrical contacts is interfaced to the microprocessor system (10) and wherein the microprocessor system (10) determines that the user has performed an integrity test when the microprocessor system (10) detects a change in a state of the test button (35).

10. A time alert device (1) to remind the user of an earth leakage protection device to perform an integrity test on the earth leakage protection device as in claim 1, wherein the tripping switch (36 FIG. 9) in the tripping initiation circuit (20) is an electromechanical switch and wherein the electromechanical switch comprises a pair of normally open contacts of an electromechanical relay; and wherein the electromechanical relay is energized to close the pair of normally open contacts upon receiving a switching-on command from the microprocessor system (10), the switching on command being delivered to the electromechanical relay once the microprocessor system (10) determines, through the test detection means (19), that the user has performed an integrity test on the earth leakage protection device, wherein the closing of the electromechanical switch completes the circuit path to earth, thereby intentionally generating an earth leakage current to trip the earth leakage protection device.

11. A time alert device (1) to remind the user of an earth leakage protection device to perform an integrity test on the earth leakage protection device as in claim 1, wherein the tripping switch (16 FIG. 1 or 2) in the tripping initiation circuit (20) comprises a first pair of contacts of a manually operated test button (5); and wherein the actuation of the test button (5) closes the tripping switch (16), completing the circuit path to earth, thereby intentionally generating an earth leakage current to trip the earth leakage protection device.

12. A time alert device (1) to remind the user of an earth leakage protection device to perform an integrity test on the earth leakage protection device as in claim 11, wherein the test detection means (19) is a test detection switch (15); and wherein the test detection switch (15) comprises a second pair of contacts of the test button (5), either mechanically or electrically interlocked, or both mechanically and electrically interlocked to the tripping switch (16) with the test detection switch (15) electrically interfaced to the microprocessor system (10) and wherein the microprocessor system (10) determines that the user has performed an integrity test when the microprocessor system (10) detects a change in the state of of the test button (5).

13. A time alert device (1) to remind the user of an earth leakage protection device to perform an integrity test on the earth leakage protection device as in claim 1, wherein the tripping initiation circuit (20) further comprises an opto-coupler (18) connected in series with the tripping switch (16) and current limiting resistor (17) in the tripping initiation circuit (20) so that the output of the opto-coupler (18) is electrically interfaced to the tripping switch (16) and wherein the tripping switch (16) in the tripping initiation circuit (20) comprises a pair of contacts of a manually operated test button (5) and wherein the actuation of the test button (5) closes the tripping switch (16), completing the circuit path to earth, thereby intentionally generating an earth leakage current to trip the earth leakage protection device.

14. A time alert device (1) to remind the user of an earth leakage protection device to perform an integrity test on the earth leakage protection device as in claim 13, wherein the test detection means (19) is the output of the opto-coupler (18), the output of the opto-coupler (18) being electrically interfaced to the microprocessor system (10) to enable the microprocessor system (10) to detects any change in state in the output of the opto-coupler (18); and wherein the microprocessor system (10) determines that the user has performed an integrity test when the microprocessor system (10) detects a change in state of the output of the opto-coupler (18).

15. A time alert device (1) to remind the user of an earth leakage protection device to perform an integrity test on the earth leakage protection device as in claim 1, wherein the tripping initiation circuit (20) further comprises a solid state relay connected in series with the tripping switch (16) and current limiting resistor (17) in the tripping initiation circuit (20) so that a pair of contacts of the solid state relay is electrically interlocked to the tripping switch (16); and wherein the tripping switch (16) in the tripping initiation circuit (20) is a manually operated test button (5) and wherein the actuation of the test button (5) closes the tripping switch (16), completing the circuit path to earth, thereby intentionally generating an earth leakage current to trip the earth leakage protection device.

16. A time alert device (1) to remind the user of an earth leakage protection device to perform an integrity test on the earth leakage protection device as in claim 15, wherein the test detection means (19) comprises the pair of contacts of the solid state relay, the pair of contacts of the solid state relay being electrically interfaced to the microprocessor system (10) to enable the microprocessor system (10) to detect any change in state in the pair of contacts of the solid state relay; and wherein the microprocessor system (10) determines that the user has performed an integrity test once the microprocessor system (10) detects a change in state of the pair of contacts of the solid state relay.

17. A time alert device (1) to remind the user of an earth leakage protection device to perform an integrity test on the earth leakage protection device as in claim 1, wherein the trip detection means (13) is a voltage sensor or a current sensor with the output of the voltage sensor or current sensor interfaced to the microprocessor system (10).

18. A time alert device (1) to remind the user of an earth leakage protection device to perform an integrity test on the earth leakage protection device as in claim 1, wherein the time alert device (1) is packaged as a portable three-prong plug adapted to plug into a socket within the electrical installation zone protected by the earth leakage protection device.

19. A time alert device (1) to remind the user of an earth leakage protection device to perform an integrity test on the earth leakage protection device as in claim 1, wherein the time alert device (1) is further provided with a message display panel which is electrically interfaced to the microprocessor system (10) via the I/O interface (25) of the microprocessor system (10) to allow the microprocessor system (10) to display a pre-defined message stored in a memory (23) of the microprocessor system (10), with the message displaying the purpose of the reminder and the action that must be performed by the user of the earth leakage protection device when the annunciator (11) is triggered on a time-out of the alert trigger timer (22) of the microprocessor system (10).

20. A time alert device (1) to remind the user of an earth leakage protection device to perform an integrity test on the earth leakage protection device as in as claim 1, wherein the time alert device (1) is built into an electrical appliance.

* * * * *